(12) United States Patent
Kwak

(10) Patent No.: US 6,687,843 B2
(45) Date of Patent: Feb. 3, 2004

(54) RAMBUS DRAM WITH CLOCK CONTROL CIRCUITRY THAT REDUCES POWER CONSUMPTION

(75) Inventor: Jong Tae Kwak, Kyoungki-do (KR)

(73) Assignee: Hyundai Electronics Industries Co., Ltd., Kyoungki-do (KR)

(*) Notice: Subject to any disclaimer, the term of this patent is extended or adjusted under 35 U.S.C. 154(b) by 608 days.

(21) Appl. No.: 09/725,899

(22) Filed: Nov. 30, 2000

(65) Prior Publication Data

US 2001/0015934 A1 Aug. 23, 2001

(30) Foreign Application Priority Data

Nov. 30, 1999 (KR) .............................. 99-53879

(51) Int. Cl.$^7$ ............................... G06F 1/04
(52) U.S. Cl. .................. 713/500; 713/322; 713/600
(58) Field of Search ................. 713/320, 322, 713/500, 501, 400, 401, 503, 600

(56) References Cited

U.S. PATENT DOCUMENTS

| 5,845,108 A | * | 12/1998 | Yoo et al. ............. 713/400 |
| 5,857,095 A | * | 1/1999 | Jeddeloh et al. ........ 713/401 |
| 6,378,018 B1 | * | 4/2002 | Tsern et al. ............ 710/313 |
| 6,553,449 B1 | * | 4/2003 | Dodd et al. ............... 711/5 |

* cited by examiner

Primary Examiner—Dennis M. Butler
(74) Attorney, Agent, or Firm—Pillsbury Winthrop LLP

(57) ABSTRACT

The present invention discloses a Rambus DRAM which can reduce power consumption by restricting generation of an unnecessary clock by improving command decryption when a command is applied with a COLC packet or COLX packet, so that the other packet cannot influence on another device.

21 Claims, 6 Drawing Sheets

RAMBUS DRAM WITH CLOCK CONTROL CIRCUITRY THAT REDUCES POWER CONSUMPTION

BACKGROUND OF THE INVENTION

1. Field of the Invention

The present invention relates in general to a Rambus DRAM. More specifically, the invention relates to an improved Rambus DRAM which can reduce power consumption by restricting generation of an unnecessary clock by improving command decryption when a command is applied with a COLC packet or COLX packet, so that the other packet cannot influence on another device.

2. Description of the Background Art

In general, a Rambus DRAM is a packet driving memory device for transmitting packet type data and control signals. Typically, a plurality of Rambus DRAMs are connected on a Rambus channel. Each Rambus DRAM is controlled by a Rambus memory controller through the Rambus channel. Here, the controller and the Rambus DRAMs respectively include an interface in order to transmit/receive a data to/from each other through the Rambus channel.

The plurality of Rambus DRAMs connected on the Rambus channel are controlled by one controller, and thus have different phase differences so as to recognize the data and control signal in an identical time. That is, the Rambus DRAM far from the controller rapidly processes the data, and the Rambus DRAM near the controller slowly processes the data.

A command packet in the Rambus DRAM includes a primary control packet (PCP) and a secondary control packet (SCP). Referring to FIGS. 1 and 2, the SCP is divided into a COLC packet (FIG. 1) and a COLX packet (FIG. 2).

As shown therein, the SCP is synchronized with a CTM/CFM clock, and thus a command is applied consecutively through five pins COL0, COL1, . . . , COL4.

In the COLC packet (FIG. 1), DC[4:0] denotes a device address where the command will be performed, and COP[3:0] denotes a command OP_code (here, OP_code implies a command code applied from an external channel). In addition, BC[3:0] denotes a bank address, and C[5:0] denotes a column address.

In the COLX packet (FIG. 2), DX[4:0] denotes a device address, and XOP[4:0] denotes a command OP_code. BX[3:0] denotes a bank address.

According to the COP[3:0] of the COLC packet, various commands including the read, write and precharge operations can be performed. According to the XOP[4:0] of the COLX packet, the current control and precharge operations can be carried out.

The COLC packet and the COLX packet can be combined and applied at the same time. In this case, the SCP can simultaneously apply a command to two devices.

When an S bit becomes '1', the two packets receive a serial data for 4 cycles, and enter into a decoding process. When the command is applied to one device by using one of the two packets, the S bit must have a value of '1', and thus the other packet also enters into the command decoding process. Since the command decoding process is performed on the unnecessary packet, a NO operation command is externally applied. However, a device ID in each packet is always matched with one of the 32 devices on a module (because device ID bits are 5 bits). In this case, another device enables an internal clock signal tclk by enabling an internal signal idhit_cas_ff1 (or idhit_cas_othr), which is called a glitch phenomenon. Whenever such a command is applied, power is unnecessarily consumed.

FIG. 3 (Prior Art) is a diagram of a conventional circuit for generating a clock enable signal tclk_en for generating the clock signal tclk. The conventional circuit includes an input signal detecting unit 10 for receiving a signal idhit_cas_ff1 detecting whether a value of DC[4:0] is identical to its device address and a signal idhit_cas_othr detecting whether a value of DX[4:0] is identical to its device address, and for enabling an output signal etck_en when at least one signal is enabled. An output signal maintaining unit 20 generates a control signal ten_in1_b for maintaining an enable state of the clock enable signal tclk_en outputted in the read or current control command. An output signal control unit 30 receives the output signal etck_en from the input signal detecting unit 10, and generates a control signal ten_in2_b for disabling the output signal tclk_en when the command is not the read or current control command. A signal generating unit 40 receives the signal idhit_cas_ff1, the signal idhit_cas_othr, the output signal ten_in1_b from the input signal detecting unit 20, and the output signal ten_in2_b from the output signal control unit 30, and generates the clock enable signal tclk_en.

When the command is applied by using the SCP command packet on the Rambus DRAM module (maximally 32 devices), the respective Rambus DRAMs on the module compare DC[4:0] and DX[4:0] with their device addresses. Each Rambus DRAM converts the signal idhit_cas_ff1 to a high level when the value of DC[4:0] is identical to their device addresses, and converts the signal idhit_cas_othr to a high level when the value of DX[4:0] is identical to their device addresses.

In the conventional circuit for generating the clock enable signal tclk_en, when one of the signals idhit_cas_ff1, idhit_cas_othr is at a high level, the output signal tclk_en from a NAND gate NA3 of the signal generating unit 40 becomes a high level, thereby generating the clock signal tclk. In addition, the output signal etck_en from a NAND gate NA1 of the input signal detecting unit 10 also becomes a high level, and thus an enable terminal EN of a flip-flop FF4 becomes a high level. Accordingly, the output signal ten_in2_b from the flip-flop FF4 is at a low level. Therefore, if not set through a set terminal S(Q=1), the output signal tclk_en from the NAND gate NA3 is maintained at a high level.

When the output signal ten_in1_b from the output signal maintaining unit 20 generated due to a special command (not the read or current control command) is at a high level, the output signal ten_in2_b from the flip-flop FF4 of the output signal control unit 30 is set after three cycles (the signal etck_en is consecutively transmitted, and thus the signal etck_en_rst becomes '1'), thereby converting a high value of the clock enable signal tclk_en to a low level.

That is, when a sequence of applying a command to one of the 32 devices on the module with one of the COLC and COLX packets is consecutively carried out, toggling of the unnecessary clock signal tclk occurs in three cycles in the device identical to the device address value of the other packet (value of DC[4:0] of the COLC packet or DX[4:0] of the COLX packet).

For example, when the 32 Rambus DRAMs are on the module, if the read command (COP=0011) is externally applied to the 10$^{th}$ device (DC=01010) with the COLC packet, the value of the COLX packet is generally 'DX=00000' and 'XOP=00000'. In this case, since the value of DX is '0', the signal idhit_cas_othr informing that the device ID is matched in the $0^{th}$ device becomes a high level. Accordingly, toggling of the clock signal tclk occurs in the $0^{th}$ device as well as the $10^{th}$ device. Thereafter, since the value of XOP is '0', the clock signal tclk is disabled after three cycles.

FIG. 4 shows an operation timing of a COL packet of the conventional Rambus DRAM. When the signal idhit_cas_othr(h) becomes a high level by applying the command with the COLX packet, the clock enable signal tclk_en(d) becomes a high level, and thus a clock signal tclka(e) and a clock signal tclkb(f) are operated, thereby generating a pulse. However, when it is judged that the command is not the read or current control command, the clock enable signal tclk_en(d) is disabled after three cycles, thereby controlling generation of the clock signals tclka, tclkb(e)(f).

In the conventional Rambus DRAM, when the SCP command is applied, the internal clock enable signal tclk_en becomes a high level, and thus the clock signal tclk is enabled. Thereafter, according to the command analysis result, if the applied command is not the read or current control command, the clock enable signal tclk_en is disabled after three cycles. Accordingly, the toggling of the clock signal tclk unnecessarily occurs in the three cycles, which results in large power consumption.

SUMMARY OF THE INVENTION

According to one aspect of the invention, there is provided a Rambus DRAM which can reduce power consumption with respect to conventional circuits by restricting generation of an unnecessary clock by improving command decryption when a command is applied with a COLC packet or COLX packet, so that the other packet cannot influence on another device.

In order to achieve the above-described object of the present invention, there is provided a Rambus DRAM including: an input signal detecting unit consisting of a first internal clock generating unit for generating a first internal clock signal according to a first comparing signal comparing an address value of a selected Rambus DRAM with an applied device address value of a COLC packet, and command code values in the COLC packet, when a command is applied with an SCP command packet on a Rambus DRAM module; a second internal clock generating unit for generating a second internal clock signal according to a second comparing signal comparing the address value of the selected Rambus DRAM with an applied device address value of a COLX packet, and command code values in the COLX packet; and a signal combining unit for generating an enable signal according to the first and second internal clock signals; a signal generating unit for generating a clock enable signal for controlling an internal data to be externally outputted; an output signal maintaining unit for generating to the signal generating unit a control signal for maintaining the clock enable signal from the signal generating unit in a read or current control command; and an output signal control unit for receiving the enable signal from the input signal detecting unit, generating a signal delayed longer than the enable signal by one cycle, and controlling the signal generating unit to generate a clock enable signal delayed by one cycle by using the delayed signal in the read or current command, and to restrict generation of the clock enable signal when the command is not the read or current control command.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION

Figure 1:
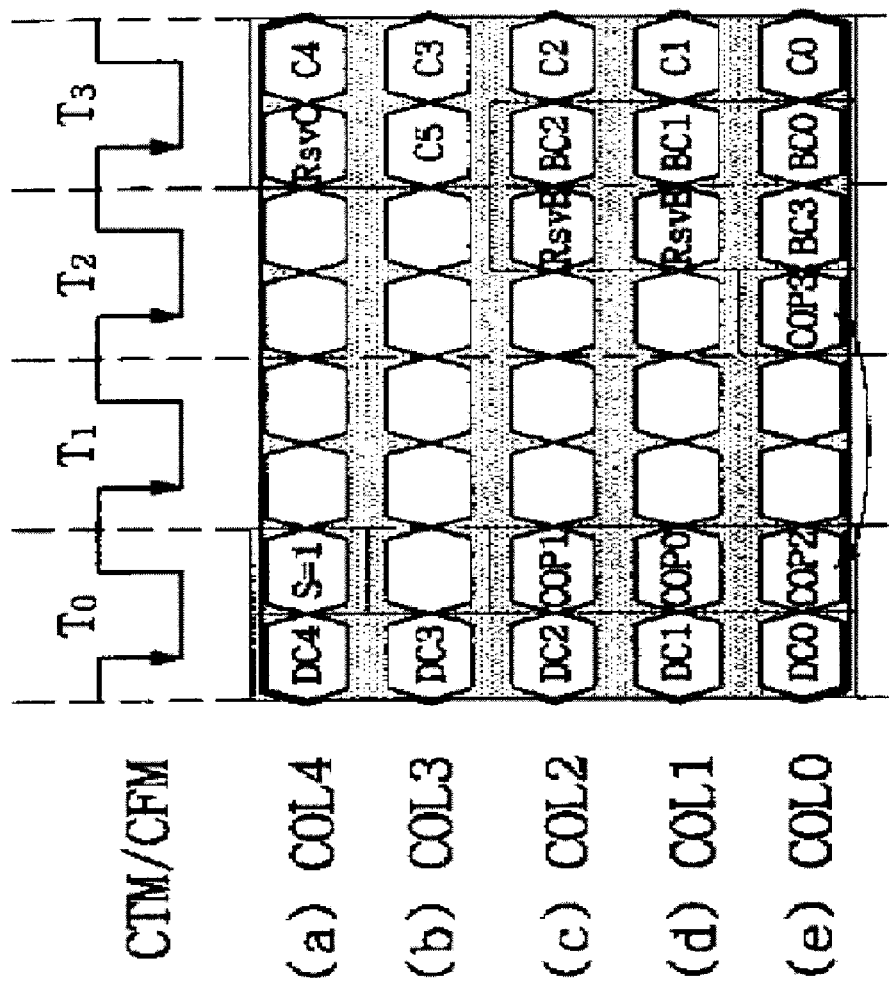
FIG. 1 a structure view illustrating a COLC packet of a conventional Rambus DRAM.
Figure 2:
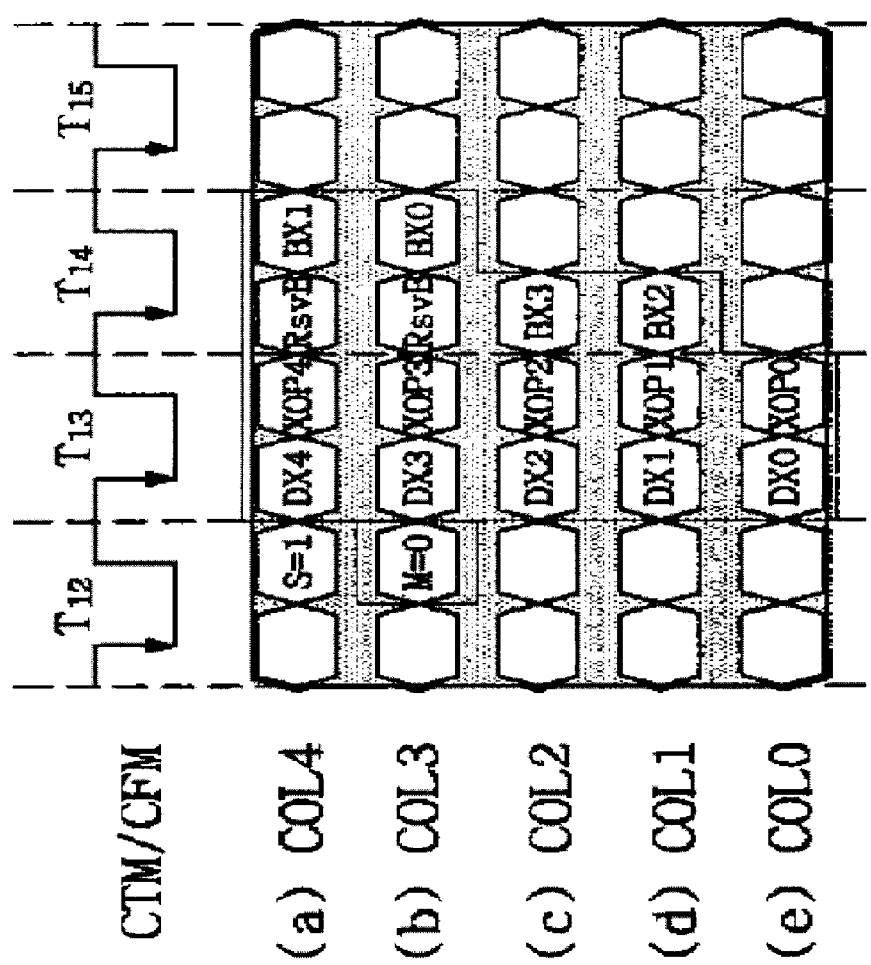
FIG. 2 a structure view illustrating a COLX packet of the conventional Rambus DRAM.
Figure 3:
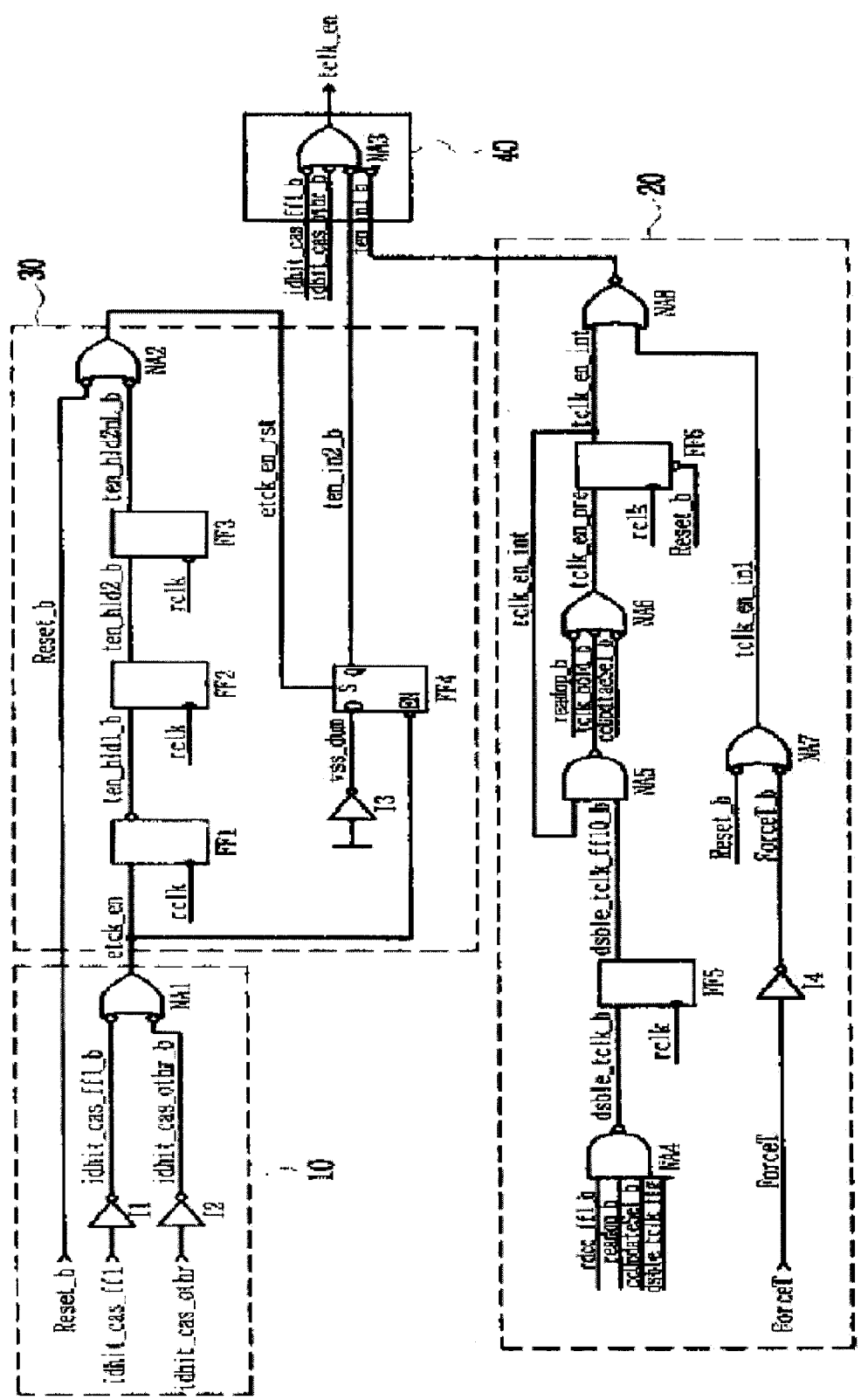
FIG. 3 illustrates a conventional circuit for generating a clock enable signal.
Figure 4:
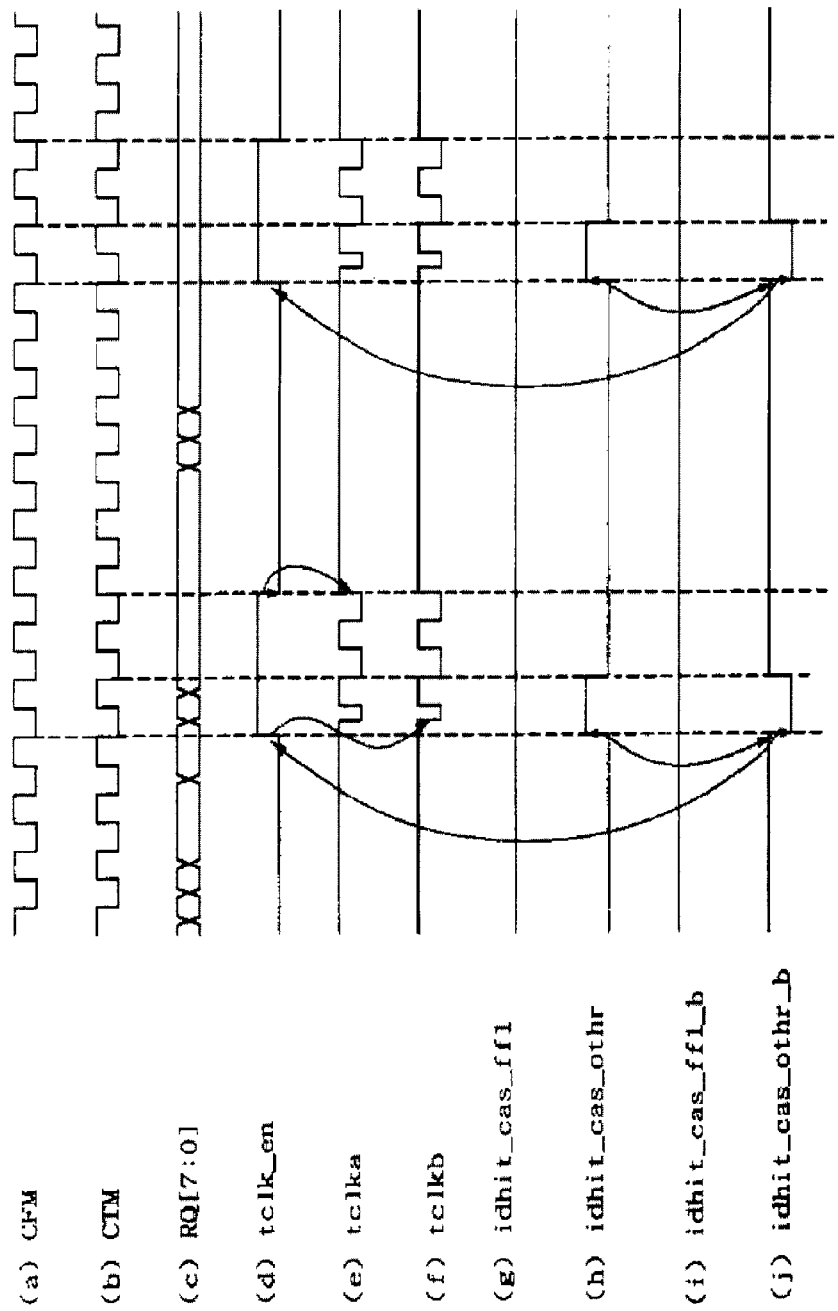
FIG. 4 is an operation timing view of a COL packet in the conventional Rambus DRAM.

A Rambus DRAM according to a preferred embodiment of the present invention will now be described in detail with reference to the accompanying drawings.

In the drawings, elements having an identical function are provided with the identical reference numeral, and repeated explanations thereof will be omitted.

Figure 5:
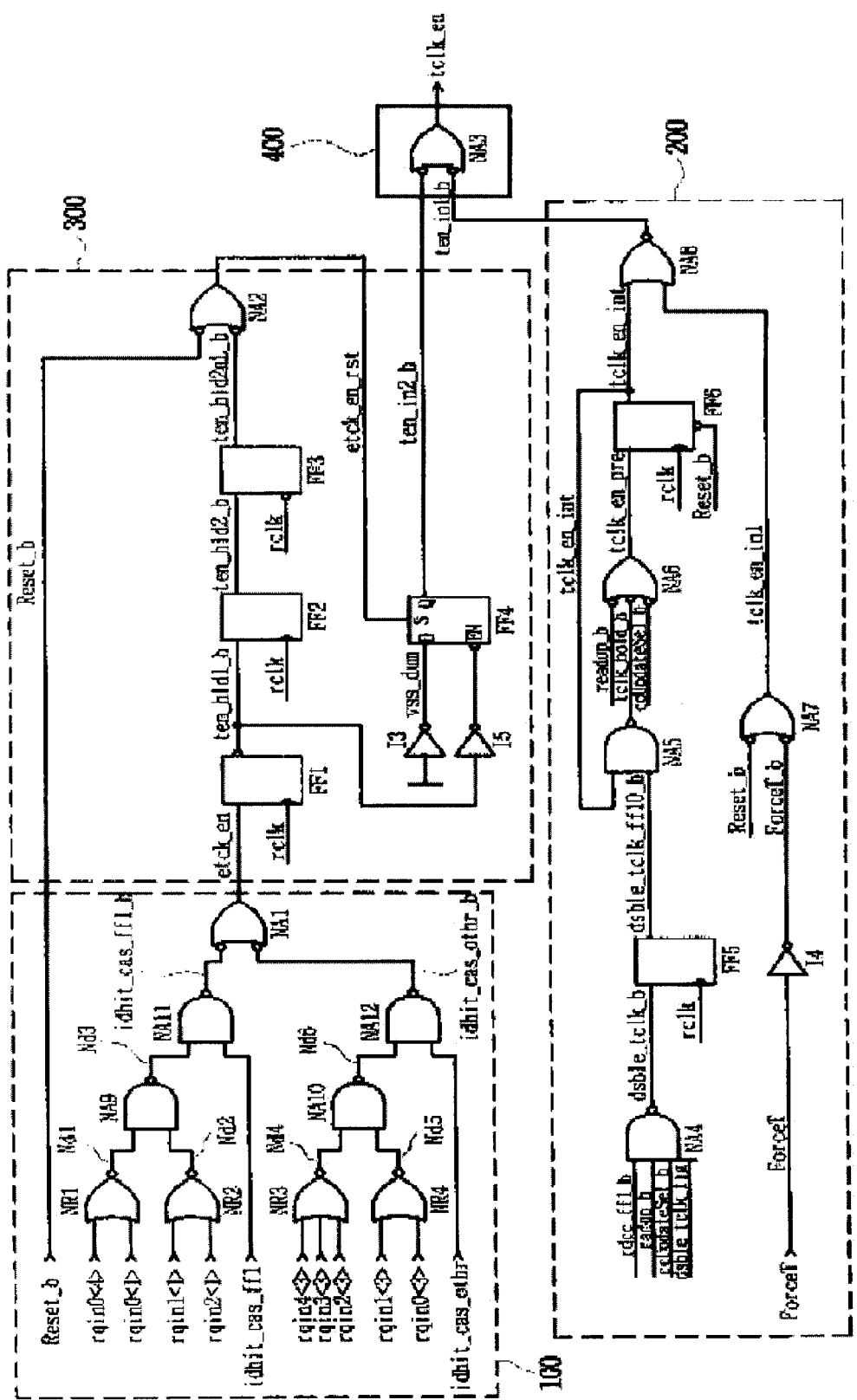
FIG. 5 illustrates a circuit for generating a clock enable signal in a Rambus DRAM in accordance with the present invention.

FIG. 5 illustrates a circuit for generating a clock enable signal tclk_en in the Rambus DRAM in accordance with the present invention. The circuit includes: an input signal detecting unit 100, an output signal maintaining unit 200, an output signal control unit 300 and a signal generating unit 400.

The input signal detecting unit 100 includes: a first internal clock generating unit NR1, NR2, NA9, NA11 for generating an internal clock signal idhit_cas_ff1_b having a low level, when a signal idhit_cas_ff1 enabled when a device address of a COLC packet is identical to an address of a selected Rambus DRAM is at a high level, and when command code values rqin0<4>, rqin0<1>, rqin1<1>, rqin2<1> in the COLC packet have a value of '1'; a second internal clock generating unit NR3, NR4, N10, NA12 for generating an internal clock signal idhit_cas_othr_b having a low logic, when a signal idhit_cas_othr enabled when a device address of a COLX packet is identical to the address of the selected Rambus DRAM is at a high level, and when command code values rqin4<3>, rqin3<3>, rqin2<3>, rqin1<3>, rqin0<3> in the COLX packet have a value of '1'; and an OR logic operation unit NA1 for outputting a high level signal etck_en when at least one internal clock signal idhit_cas_ff1_b, idhit_cas_othr_b is at a low level. Here, the first internal clock generating unit NR1, NR2, NA9, NA11 includes: a NOR gate NR1 for receiving a signal rqin0<4> corresponding to a COP[3] signal and a signal rqin0<1> corresponding to a COP[2] signal in COP[3:0] which is an op_code of the COLC packet; a NOR gate NR2 for receiving a signal rqin1<1> corresponding to the COP[3] signal and a signal rqin2<1> corresponding to a COP[1] signal; a NAND gate NA9 for receiving output signals from the NOR gates NR1, NR2; and a NAND gate NA11 for receiving an output signal Nd3 from the NAND gate NA9 and the signal idhit_cas_ff1, and outputting the signal idhit_cas_ff1_b. The second internal clock generating unit NR3, NR4, NA11, NA12 includes: a NOR gate NR3 for receiving a signal rqin4<3> corresponding to an XOP[4] signal and a signal rqin3<3> corresponding to an XOP[3] signal in XOP[4:0] which is an op_code of the COLX packet; a NOR gate NR4 for receiving a signal rqin1<3> corresponding to an XOP[1] signal, and a signal rqin0<3> corresponding to an XOP[0] signal; a NAND gate NA10 for receiving output signals from the NOR gates NR3, NR4; and a NAND gate NA12 for receiving an output signal Nd6 from the NAND gate NA10 and the signal idhit_cas_othr, and outputting the signal idhit_cas_othr_b. The OR logic operation unit NA1 includes an OR gate NA1 for receiving an inverted signal of the output signal idhit_cas_ff1_b from the NAND gate NA11 and an inverted signal of the output signal idhit_cas_othr_b from the NAND gate NA12, and outputting the signal etck_en.

In the read or current control command, the output signal maintaining unit 200 outputs to the signal generating unit 400 a signal ten_in1_b for controlling the output signal tclk_en from the signal generating unit 400 to have a high level.

The output signal control unit 300 controls the one cycle delayed clock enable signal tclk_en to be outputted in the read or current control command, by using an one cycle delayed signal ten_hld1_b of the output signal etck_en from the input signal detecting unit 100. When the command is not the read or current control command, the output signal control unit 300 controls the signal generating unit 400 to restrict generation of the clock enable signal tclk_en. The output signal control unit 300 includes: a first flip-flop FF1 for receiving the output signal etck_en from the input signal detecting unit 100 as an input signal, and a clock signal rclk as a clock input; a second flip-flop FF2 for receiving the inverted signal ten_hld1_b of the output signal from the first flip-flop FF1 as an input signal, and the clock signal rclk as a clock input; a third flip-flop FF3 for receiving the output signal ten_hld2_b from the second flip-flop FF2 as an input signal, and an inverted signal of the clock signal rclk as an enable signal; an OR gate NA2 for receiving an inverted signal of the output signal ten_hld2nL_b from the third flip-flop FF3 and an inverted signal of a reset bar signal Reset_b; and a fourth flip-flop FF4 for receiving the output signal ten_hid1_b from the first flip-flop FF1 as an enable signal, an output signal etck_en_rst from the OR gate NA2 as a set signal, and a ground voltage Vss_dum as an input signal, and for outputting an output signal ten_in2_b to the signal generating unit 400.

The signal generating unit 400 includes an OR gate NA3 for receiving an inverted signal of the output signal ten_in2_b from the output signal control unit 300 and an inverted signal of the output signal ten_in1_b from the output signal maintaining unit 200, and for generating the clock enable signal tclk_en.

When the command is applied with the SCP command packet on a Rambus DRAM module (maximally 32 devices), the respective Rambus DRAMs on the module compare DC[4:0] and DX[4:0] with their device addresses. Each Rambus DRAM converts the signal idhit_cas_ff1 to a high level when the value of DC[4:0] is identical to their device addresses, and converts the signal idhit_cas_othr to a high level when the value of DX[4:0] is identical to their device addresses.

Here, when the signal idhit_cas_ff1 enabled when the address of the selected Rambus DRAM is identical to the device address of the COLC packet is at a high level, and when the values of the COP[3:0] which is a command code in the packet are '1', the signal idhit_cas_ff1_b becomes a low level, and thus the output signal etck_en from the input signal detecting unit 100 becomes a high level. Thus, the enable terminal EN of the fourth flip-flop FF4 of the output signal control unit 300 becomes a high level, thereby converting the output signal ten_in2_b from the fourth flip-flop FF4 into a low level. As a result, the output signal tclk_en from the signal generating unit 400 is at a high level.

As shown in FIG. 5, rqin0<4>, rqin0<1>, rqin1<1>, rqin2<1> imply the COP[3:0] of the COLC packet. Their OR signal Nd3 and the signal idhit_cas_ff1 are NAND operated by the NAND gate NA11, and thus the signal idhit_cas_ff1_b is output. Here, when all the values of the COP[3:0] are not '0' (NO operation), the inverted signal of the signal idhit_cas_ff1 is output as the signal idhit_cas_ff1_b.

In the same manner, an OR signal of the values of the XOP[4:0] in the COLX packet and the signal idhit_cas_othr which is the device address match signal are NAND operated by the NAND gate NA12, and thus the signal idhit_cas_othr_b is output. Here, when the values of the XOP[4:0] are all '0' (NO operation), the signal idhit_cas_othr_b is at a high level, regardless of the signal idhit_cas_othr. Accordingly, even if the signal idhit_cas_othr becomes a high level, the output signal tclk_en is not at a high level.

In addition, in accordance with the present invention, the signal ten_hld1_b delayed longer than the signal etck_en by one cycle is used as the enable signal EN inputted to the fourth flip-flop FF4 of the output signal control unit 300. Therefore, a signal enabled at a high level later than the output signal tclk_en by one cycle is generated.

In the conventional circuit for generating the clock enable signal tclk_en, the clock enable signal tclk_en is set to be generated much earlier than a read operation. Accordingly, when the output signal tclk_en is enabled one cycle later as in the present invention, the circuit operation is normally operated, and power is less consumed.

Therefore, the present invention does not require the signals idhit_cas_ff1_b, idhit_cas_othr_b inputted to a conventional signal generating unit 40. In the conventional art, whenever the signals become a low level, the output signal tclk_en is generated at a high level. Thus, the signals must be removed to enable the output signal tclk_en one cycle later.

As depicted in FIG. 5, the OR gate NA3 receives and ORs the inverted signal of the output signal ten_in2_b from the output signal control unit 300 and an inverted signal of the output signal ten_in1_b from the signal maintaining unit 200, thereby generating the output signal tclk_en.

Figure 6:
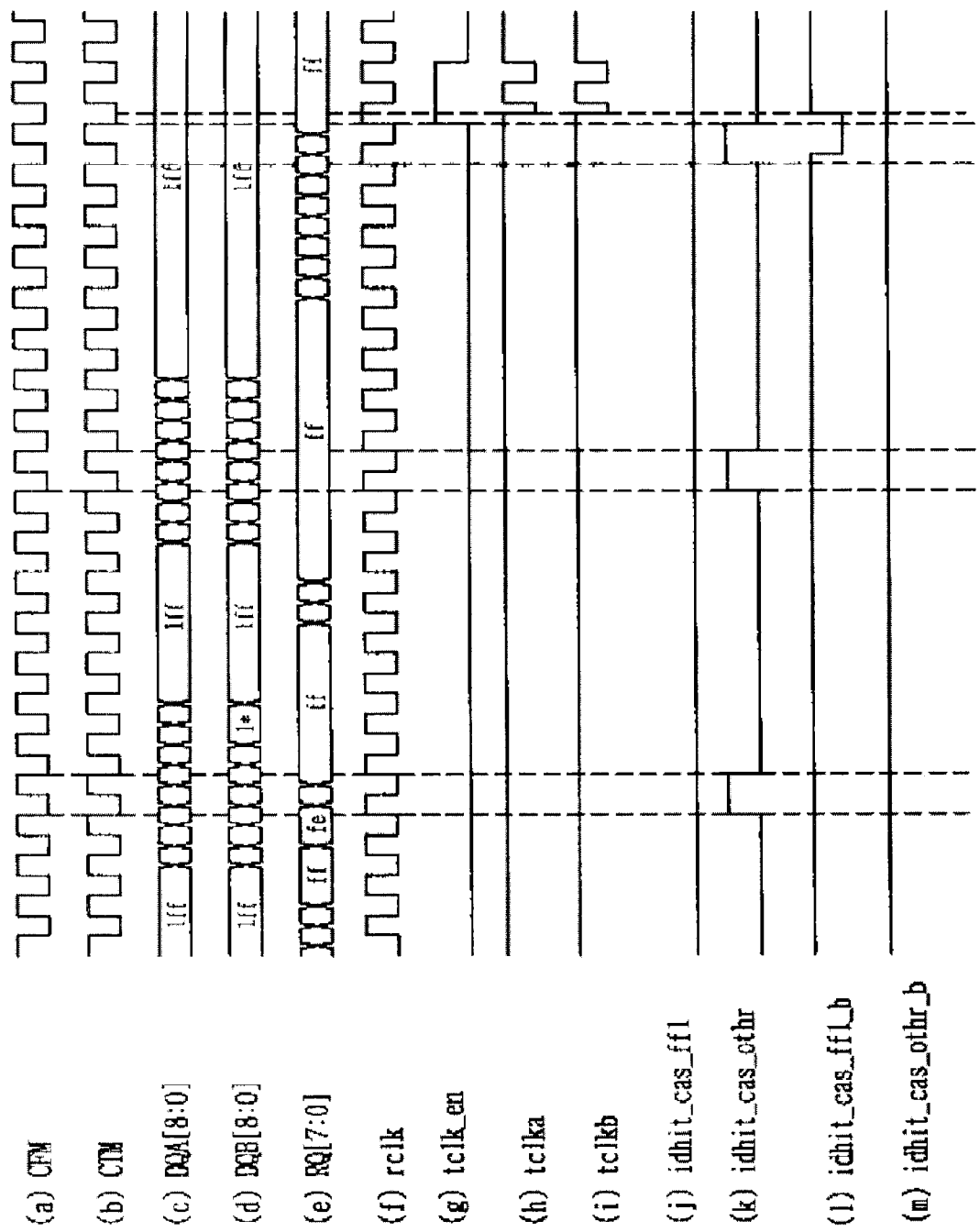
FIG. 6 is an operation timing view of a COL packet in the Rambus DRAM in accordance with the present invention.

FIG. 6 is an operation timing view of a COL packet in the Rambus DRAM in accordance with the present invention.

DX of the COLX packet has a value of '0', and thus the signal idhit_cas_othr becomes a high level. However, since the values of the XOP are '0', the signal idhit_cas_othr_b is maintained at a high level, and thus toggling of the signal tclk does not occur. The signal tclk is enabled one cycle later, and as a result power consumption is reduced and the glitch is stably removed.

As discussed earlier, when the command is applied with the COLC or COLX packet, the Rambus DRAM of the present invention prevents an unnecessary clock operation by improving command decryption so that the other packet cannot influence on another device, which results in reduced power consumption.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A Rambus DRAM comprising:
an input signal detecting means including a first internal clock generating unit for generating a first internal clock signal according to a first comparing signal comparing an address value of a selected Rambus DRAM with an applied device address value of a COLC packet, and command code values in the COLC packet, when a command is applied with an SCP command packet on a Rambus DRAM module; a second internal clock generating unit for generating a second internal clock signal according to a second comparing signal comparing the address value of the selected Rambus DRAM with an applied device address value of a COLX packet, and command code values in the COLX packet; and a signal combining unit for generating an enable signal according to the first and second internal clock signals;
a signal generating means for generating a clock enable signal for controlling an internal data to be externally output;
an output signal maintaining means for generating to the signal generating means a control signal for maintaining the clock enable signal from the signal generating means in a read or current control command; and
an output signal control means for receiving the enable signal from the input signal detecting means, generating a signal delayed longer than the enable signal by one cycle, and controlling the signal generating means to generate a clock enable signal delayed by one cycle by using the delayed signal in the read or current command, and to restrict generation of the clock enable signal when the command is not the read or current control command.

2. The Rambus DRAM according to claim 1, wherein the first and second internal clock generating units generate the first internal clock signal having a second potential level, when the first comparing signal has a first potential level and all command code values in the COLC packet have the first potential level, and generate the second internal clock signal having the second potential level, when the second comparing signal has the first potential level and all command code values in the COLX packet have the first potential level.

3. The Rambus DRAM according to claim 2, wherein the first potential level is a logic high level and the second potential level is a logic low level.

4. The Rambus DRAM according to claim 1, wherein the first internal clock generating unit comprises:
a first NOR gate for receiving a first signal corresponding to a COP[3] signal and a second signal corresponding to a COP[2] signal in COP[3:0] which is an op_code of the COLC packet;
a second NOR gate for receiving a third signal corresponding to the COP[3] signal and a fourth signal corresponding to a COP[1] signal;
a first NAND gate for receiving output signals from the first NOR gate and the second NOR gate; and
a second NAND gate for receiving an output signal from the first NAND gate and the first comparing signal.

5. The Rambus DRAM according to claim 4, wherein the first comparing signal is generated when a device address of a COLC packet is identical to an address of a selected Rambus DRAM.

6. The Rambus DRAM according to claim 4, wherein the second internal clock generating unit comprises:
a third NOR gate for receiving a sixth signal corresponding to an XOP[4] signal and a seventh signal corresponding to an XOP[3] signal and a eighth signal corresponding to an XOP[2] signal in XOP[4:0] which is an op_code of the COLX packet;
a fourth NOR gate for receiving a ninth signal corresponding to an XOP[1] signal, and a tenth signal corresponding to an XOP[0] signal;
a third NAND gate for receiving output signals from the third NOR gate and the fourth NOR gate; and
a fourth NAND gate for receiving an output signal from the third NAND gate and the second comparing signal.

7. The Rambus DRAM according to claim 6, wherein the second comparing signal is generated when a device address of a COLX packet is identical to an address of a selected Rambus DRAM.

8. The Rambus DRAM according to claim 7, wherein a eleventh signal is a complement signal of the second comparing signal.

9. The Rambus DRAM according to claim 6, wherein the signal combining unit comprises: a first OR gate for receiving an inverted signal of the output signal from the second NAND gate and an inverted signal of the output signal from the NAND gate.

10. The Rambus DRAM according to claim 1, wherein the output signal control means comprises:
a first flip-flop for receiving the output signal from the input signal detecting means, synchronizing the signal with a clock signal, and outputting the resultant signal;
a second flip-flop for receiving an inverted signal of the output signal from the first flip-flop, synchronizing the signal with the clock signal, and outputting the resultant signal;
a third flip-flop for receiving the output signal from the second flip-flop, and an inverted signal of the clock signal as an enable signal;
a second OR gate for receiving an inverted signal of the output signal from the third flip-flop and an inverted signal of a reset bar signal; and
a fourth flip-flop for receiving the output signal from the first flip-flop as an enable signal, an output signal from the second OR gate as a set signal, and a ground voltage as an input signal, and for outputting an output signal to the signal generating means.

11. The Rambus DRAM according to claim 1, wherein the signal generating means comprises: a third OR gate for receiving an inverted signal of the output signal from the output signal control means and an inverted signal of the output signal from the output signal maintaining means, and for generating the clock enable signal.

12. A Rambus DRAM comprising:
an input signal detecting circuit arrangement including a first internal clock generator for generating a first internal clock signal according to a first comparing signal comparing an address value of a selected Rambus DRAM with an applied device address value of a COLC packet, and command code values in the COLC packet, when a command is applied with an SCP command packet on a Rambus DRAM module; a second internal clock generator for generating a second internal clock signal according to a second comparing signal comparing the address value of the selected Rambus DRAM with an applied device address value of a COLX packet, and command code values in the COLX packet; and a signal combiner constructed and arranged to generate an enable signal according to the first and second internal clock signals;

a signal generator constructed and arranged to generate a clock enable signal for controlling an internal data to be externally output;

an output signal maintaining circuit arrangement constructed and arranged to generate to the signal generator a control signal useful for maintaining the clock enable signal from the signal generator in a read or current control command; and an output signal control circuit arrangement constructed and arranged to receiving the enable signal from the input signal detecting circuit arrangement, generate a signal delayed longer than the enable signal by one cycle, and controlling the signal generator to generate a clock enable signal delayed by one cycle by using the delayed signal in the read or current command, and to restrict generation of the clock enable signal when the command is not the read or current control command.

13. The Rambus DRAM according to claim 12, wherein the first and second internal clock generators generate the first internal clock signal having a second potential level, when the first comparing signal has a first potential level and all command code values in the COLC packet have the first potential level, and generate the second internal clock signal having the second potential level, when the second comparing signal has the first potential level and all command code values in the COLX packet have the first potential level.

14. The Rambus DRAM according to claim 13, wherein the first potential level is a logic high level and the second potential level is a logic low level.

15. The Rambus DRAM according to claim 12, wherein the first internal clock generator comprises:
   a first NOR gate for receiving a first signal corresponding to a COP[3] signal and a second signal corresponding to a COP[2] signal in COP[3:0] which is an op_code of the COLC packet;
   a second NOR gate for receiving a third signal corresponding to the COP[3] signal and a fourth signal corresponding to a COP[1] signal;
   a first NAND gate for receiving output signals from the first NOR gate and the second NOR gate; and
   a second NAND gate for receiving an output signal from the first NAND gate and the first comparing signal.

16. The Rambus DRAM according to claim 15, wherein the first comparing signal is generated when a device address of a COLC packet is identical to an address of a selected Rambus DRAM.

17. The Rambus DRAM according to claim 15, wherein the second internal clock generator comprises:
   a third NOR gate for receiving a sixth signal corresponding to an XOP[4] signal and a seventh signal corresponding to an XOP[3] signal and a eighth signal corresponding to an XOP[2] signal in XOP[4:0] which is an op_code of the COLX packet;
   a fourth NOR gate for receiving a ninth signal corresponding to an XOP[1] signal, and a tenth signal corresponding to an XOP[0] signal;
   a third NAND gate for receiving output signals from the third NOR gate and the fourth NOR gate; and
   a fourth NAND gate for receiving an output signal from the third NAND gate and the second comparing signal.

18. The Rambus DRAM according to claim 17, wherein the second comparing signal is generated when a device address of a COLX packet is identical to an address of a selected Rambus DRAM.

19. The Rambus DRAM according to claim 17, wherein the signal combiner comprises: a first OR gate for receiving an inverted signal of the output signal from the second NAND gate and an inverted signal of the output signal from the NAND gate.

20. The Rambus DRAM according to claim 12, wherein the output signal control circuit arrangement comprises:
   a first flip-flop for receiving the output signal from the input signal detecting circuit arrangement, synchronizing the signal with a clock signal, and outputting the resultant signal;
   a second flip-flop for receiving an inverted signal of the output signal from the first flip-flop, synchronizing the signal with the clock signal, and outputting the resultant signal;
   a third flip-flop for receiving the output signal from the second flip-flop, and an inverted signal of the clock signal as an enable signal;
   a second OR gate for receiving an inverted signal of the output signal from the third flip-flop and an inverted signal of a reset bar signal; and
   a fourth flip-flop for receiving the output signal from the first flip-flop as an enable signal, an output signal from the second OR gate as a set signal, and a ground voltage as an input signal, and for outputting an output signal to the signal generator.

21. The Rambus DRAM according to claim 12, wherein the signal generator comprises: a third OR gate for receiving an inverted signal of the output signal from the output signal control circuit arrangement and an inverted signal of the output signal from the output signal maintaining circuit arrangement, and for generating the clock enable signal.

* * * * *

UNITED STATES PATENT AND TRADEMARK OFFICE
CERTIFICATE OF CORRECTION

PATENT NO. : 6,687,843 B2  Page 1 of 1
DATED : February 3, 2004
INVENTOR(S) : Jong Tae Kwak It is certified that error appears in the above-identified patent and that said Letters Patent is hereby corrected as shown below:

<u>Title page,</u>
Item [30], Foreign Application Priority Data, replace "99-53879" with -- 99-53897 --.

Signed and Sealed this

Eighteenth Day of May, 2004

JON W. DUDAS
*Acting Director of the United States Patent and Trademark Office*